US011380563B2

(12) United States Patent
Takeda et al.

(10) Patent No.: US 11,380,563 B2
(45) Date of Patent: Jul. 5, 2022

(54) SUBSTRATE PROCESSING APPARATUS, PLURALITY OF ELECTRODES AND METHOD OF MANUFACTURING SEMICONDUCTOR DEVICE

(71) Applicant: KOKUSAI ELECTRIC CORPORATION, Tokyo (JP)

(72) Inventors: Tsuyoshi Takeda, Toyama (JP); Daisuke Hara, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 58 days.

(21) Appl. No.: 16/558,506

(22) Filed: Sep. 3, 2019

(65) Prior Publication Data
US 2020/0083067 A1 Mar. 12, 2020

(30) Foreign Application Priority Data

Sep. 11, 2018 (JP) .............................. JP2018-169453

(51) Int. Cl.
*H01J 37/32* (2006.01)
*H01L 21/67* (2006.01)

(52) U.S. Cl.
CPC .. *H01L 21/67098* (2013.01); *H01J 37/32449* (2013.01); *H01J 37/32532* (2013.01); *H01L 21/67017* (2013.01)

(58) Field of Classification Search
CPC .......... H01J 37/32449; H01J 21/67017; H01J 21/67098; H01J 37/32532
See application file for complete search history.

(56) References Cited

U.S. PATENT DOCUMENTS

2005/0205110 A1* 9/2005 Kao .................. H01L 21/02104
134/1.1
2015/0007772 A1 1/2015 Fukushima et al.
(Continued)

FOREIGN PATENT DOCUMENTS

JP 2007-059527 A 3/2007
JP 2007059527 A * 3/2007
(Continued)

OTHER PUBLICATIONS

Taiwanese Office Action dated Apr. 9, 2020 for the Taiwanese Patent Application No. 108122841.
(Continued)

*Primary Examiner* — Yuechuan Yu
(74) *Attorney, Agent, or Firm* — Volpe Koenig

(57) ABSTRACT

There is provided a technique, which includes: a reaction tube configured to form a process chamber in which a substrate is processed; an electrode fixing jig installed outside the reaction tube and configured to fix at least two electrodes for forming plasma in the process chamber; and a heating device installed outside the electrode fixing jig and configured to heat the reaction tube, wherein the at least two electrodes include at least one electrode to which a predetermined potential is applied and at least one electrode to which a reference potential is applied, and wherein a surface area of the at least one electrode to which the predetermined potential is applied is two times or more than a surface area of the at least one electrode to which the reference potential is applied.

16 Claims, 10 Drawing Sheets

(56) References Cited

U.S. PATENT DOCUMENTS

| | | | |
|---|---|---|---|
| 2015/0107517 A1* | 4/2015 | Hasebe | C23C 16/452 118/723 E |
| 2017/0047203 A1 | 2/2017 | Glinsner et al. | |
| 2018/0182601 A1 | 6/2018 | Takeda et al. | |
| 2019/0206705 A1 | 7/2019 | Takeda et al. | |

FOREIGN PATENT DOCUMENTS

| | | | |
|---|---|---|---|
| JP | 2007-324477 A | | 12/2007 |
| JP | 2007324477 A | * | 12/2007 |
| JP | 2008-166418 A | | 7/2008 |
| JP | 2017-520080 A | | 7/2017 |
| JP | 2018-107304 A | | 7/2018 |
| KR | 101101751 B1 | | 1/2012 |
| KR | 10-2015-0004274 A | | 1/2015 |
| WO | 2018/055700 A1 | | 1/2019 |

OTHER PUBLICATIONS

Japanese Office Action dated Feb. 16, 2021 for Japanese Patent Application No. 2018-169453.
Korean Office Action dated Jul. 17, 2020 for Korean Patent Application No. 10-2019-0109038.
Taiwan Office Action dated Nov. 22, 2021 for Taiwan Patent Application No. 108122841.

* cited by examiner

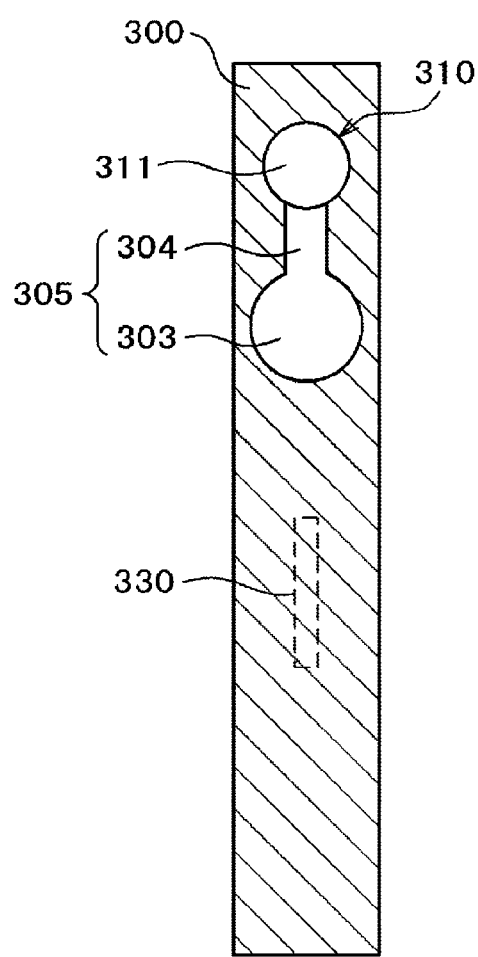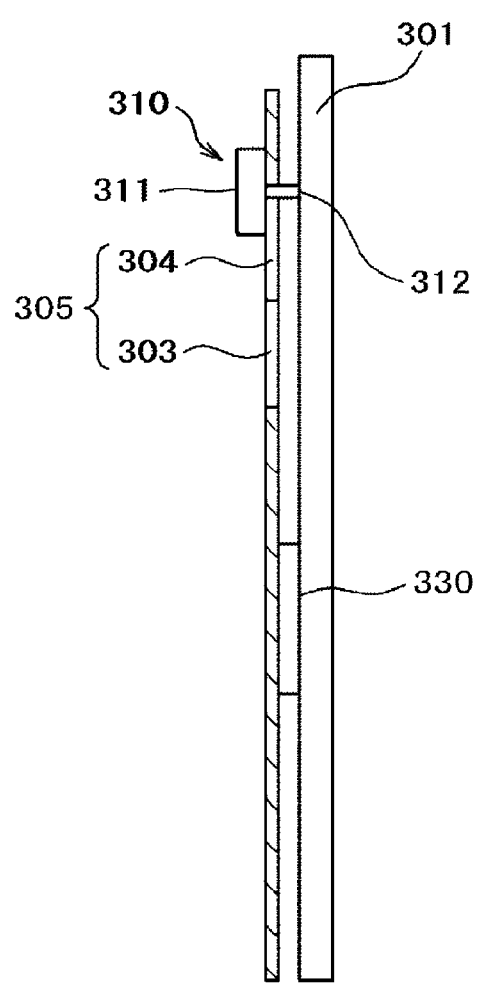

SUBSTRATE PROCESSING APPARATUS, PLURALITY OF ELECTRODES AND METHOD OF MANUFACTURING SEMICONDUCTOR DEVICE

CROSS-REFERENCE TO RELATED APPLICATION

This application is based upon and claims the benefit of priority from Japanese Patent Application No. 2018-169453, filed on Sep. 11, 2018, the entire contents of which are incorporated herein by reference.

TECHNICAL FIELD

The present disclosure relates to a substrate processing apparatus, a plurality of electrodes, and a method of manufacturing a semiconductor device.

BACKGROUND

As an example of processes of manufacturing a semiconductor device, substrate processing of forming or removing various films such as an insulating film, a semiconductor film, a conductor film, and the like on a substrate is often carried out by loading a substrate into a process chamber of a substrate processing apparatus and supplying a precursor gas and a reaction gas into the process chamber.

In the case of a mass-produced device on which a fine pattern is formed, a temperature needs to be reduced in order to suppress diffusion of impurities and to enable the use of a material having low heat resistance such as an organic material.

Although substrate processing is generally performed by using plasma in order to cope with such situation, when a plasma electrode is deformed due to aging and heat from a heating device, the amount of active species such as ions or radicals generated by plasma may be reduced or a variation may occur in their generation distribution, making it difficult to uniformly process a film while maintaining the capability.

SUMMARY

The present disclosure provides some embodiments of a technique capable of performing uniform substrate processing while maintaining a capability to generate active species by a plasma electrode.

According to one embodiment of the present disclosure, there is provided a technique, which includes: a reaction tube configured to form a process chamber in which a substrate is processed; an electrode fixing jig installed outside the reaction tube and configured to fix at least two electrodes for forming plasma in the process chamber; and a heating device installed outside the electrode fixing jig and configured to heat the reaction tube, wherein the at least two electrodes include at least one electrode to which a predetermined potential is applied and at least one electrode to which a reference potential is applied, and wherein a surface area of the at least one electrode to which the predetermined potential is applied is two times or more than a surface area of the at least one electrode to which the reference potential is applied.

BRIEF DESCRIPTION OF DRAWINGS

FIG. 4A is a front view of an electrode according to an embodiment of the present disclosure, and FIG. 4B is a view illustrating that the electrode is fixed to the quartz cover.

FIGS. 5A to 5E are views illustrating shapes of one electrode and a combination example of the electrode and a spacer using the electrode as a base according to an embodiment of the present disclosure, in which FIG. 5A is an example of a flat electrode and a row of spacer, FIG. 5B is an example of a flat electrode and two rows of spacers, FIG. 5C is an example of a V-shaped electrode and a row of spacer, FIG. 5D is an example of an inverse V-shaped electrode and two rows of spacers, and FIG. 5E is an example of a W-shaped electrode and two rows of spacers.

DETAILED DESCRIPTION

An Embodiment of the Present Disclosure

An embodiment of the present disclosure will now be described with reference to FIGS. 1 to 5E.

(1) Configuration of the Substrate Processing Apparatus (Heating Device)

Figure 1:
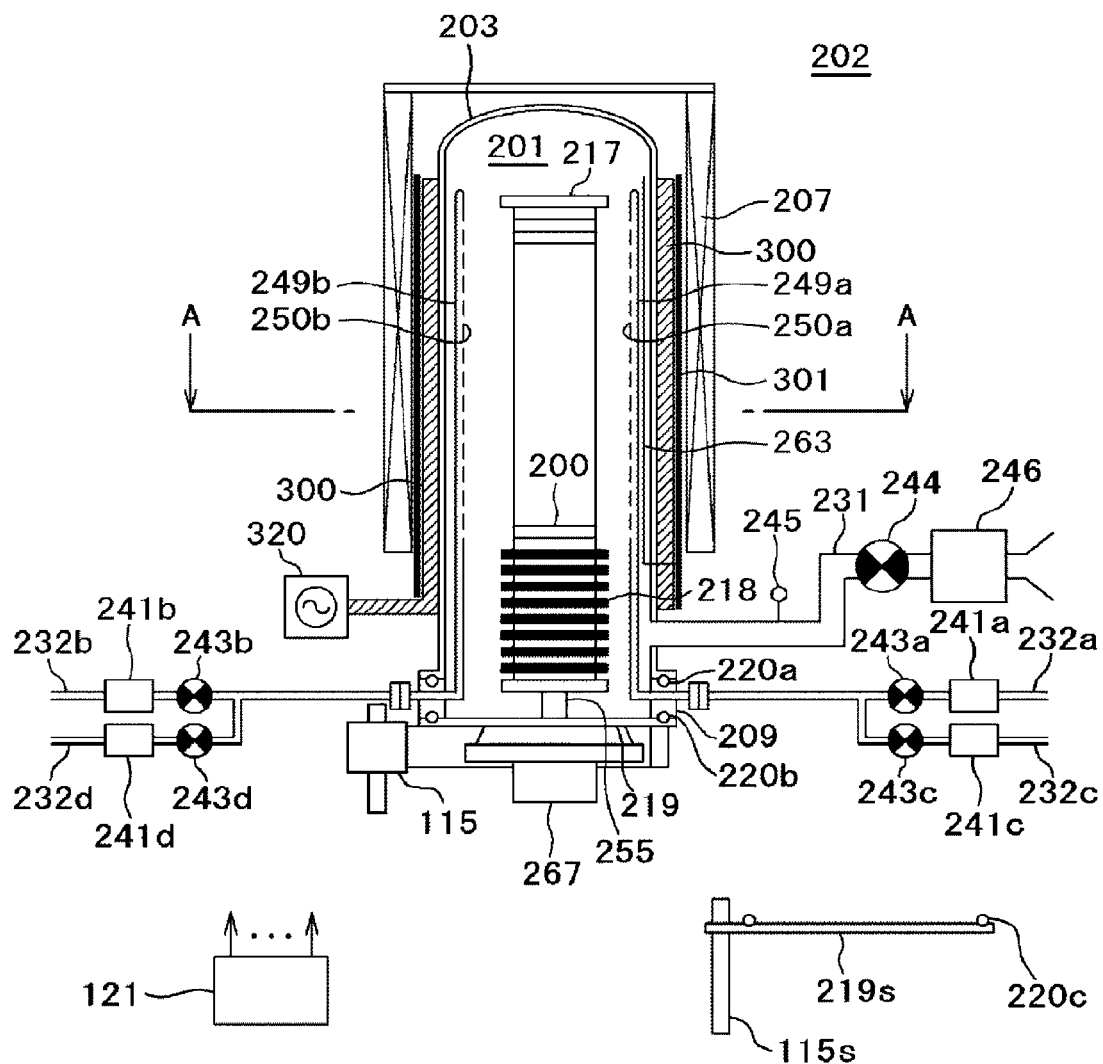
FIG. 1 is a schematic configuration diagram of a vertical type process furnace of a substrate processing apparatus suitably used in an embodiment of the present disclosure, in which a portion of the process furnace is shown in a vertical cross-sectional view.

As illustrated in FIG. 1, a process furnace 202 includes a heater 207 as a heating device (heating mechanism). The heater 207 has a cylindrical shape and is supported by a heater base (not shown) as a holding plate so as to be vertically installed. Further, the heater 207 is installed outside a quartz cover 301 as an electrode fixing jig which will be described later. The heater 207 functions as an activation mechanism (an excitation part) configured to thermally activate (excite) a gas, as described hereinbelow.

(Process Chamber)

The quartz cover 301 as the electrode fixing jig as described hereinbelow is disposed inside the heater 207, and electrodes 300 of a plasma generating part as described hereinbelow is disposed inside the quartz cover 301. In addition, a reaction tube 203 is disposed inside the electrodes 300 to be concentric with the heater 207. The reaction tube 203 is made of a heat resistant material, e.g., quartz ($SiO_2$), silicon carbide (SiC) or the like, and has a cylindrical shape with its upper end closed and its lower end opened. A manifold 209 is disposed below the reaction tube 203 in a concentric relationship with the reaction tube 203. The manifold 209 is made of metal, e.g., stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. The manifold 209 is supported by the heater base. Thus, the reaction tube 203 comes to be in a vertically mounted state. A process vessel (reaction vessel) is mainly configured by the reaction tube 203 and the manifold 209. A process chamber 201 is formed in a hollow cylindrical portion of the process vessel. The process chamber 201 is configured to accommodate a plurality of wafers 200 as substrates. The reaction tube 203 forms the process chamber 201 in which the wafers 200 are processed. The process vessel is not limited to the aforementioned configuration, and only the reaction tube 203 may be referred to as the process vessel.

(Gas Supply Part)

Nozzles 249a and 249b are installed in the process chamber 201 so as to penetrate a sidewall of the manifold 209. Gas supply pipes 232a and 232b are respectively connected to the nozzles 249a and 249b. In this manner, two nozzles 249a and 249b and two gas supply pipes 232a and 232b are installed in the process vessel and are capable of supplying plural types of gases into the process chamber 201. Further, when only the reaction tube 203 is used as the process vessel, the nozzles 249a and 249b may be installed to penetrate a sidewall of the reaction tube 203.

Mass flow controllers (MFCs) 241a and 241b, which are flow rate controllers (flow rate control parts), and valves 243a and 243b, which are opening/closing valves, are respectively installed in the gas supply pipes 232a and 232b sequentially from the corresponding upstream sides. Gas supply pipes 232c and 232d, which supply an inert gas, are respectively connected to the gas supply pipes 232a and 232b at the downstream sides of the valves 243a and 243b, respectively. MFCs 241c and 241d and valves 243c and 243d are respectively installed in the gas supply pipes 232c and 232d sequentially from the corresponding upstream sides.

The nozzles 249a and 249b are respectively disposed in a space with an annular plan-view shape between the inner wall of the reaction tube 203 and the wafers 200 such that the nozzles 249a and 249b extend upward along an arrangement direction of the wafers 200 from a lower portion to an upper portion of the inner wall of the reaction tube 203. That is, the nozzles 249a and 249b are installed in a perpendicular relationship with the surfaces (flat surfaces) of the wafers 200 at a lateral side of the end portions (peripheral edge portions) of the wafers 200 which are carried into the process chamber 201. Gas supply holes 250a and 250b for supplying a gas are installed on the side surfaces of the nozzles 249a and 249b, respectively. The gas supply holes 250a are opened toward the center of the reaction tube 203 so as to allow a gas to be supplied toward the wafers 200. The gas supply holes 250a and 250b may be formed in a plural number between the lower portion and the upper portion of the reaction tube 203.

As described above, in the present embodiment, a gas is transferred through the nozzles 249a and 249b, which are disposed in a vertically-elongated space with an annular plan-view shape, i.e., a cylindrical space, defined by the inner surface of the sidewall of the reaction tube 203 and the end portions (peripheral edge portions) of the plurality of the wafers 200 arranged within the reaction tube 203. The gas is initially injected into the reaction tube 203, near the wafers 200, through the gas supply holes 250a and 250b respectively formed in the nozzles 249a and 249b. Accordingly, the gas supplied into the reaction tube 203 mainly flows in the reaction tube 203 in a direction parallel to surfaces of the wafers 200, i.e., in a horizontal direction. With this configuration, the gas can be uniformly supplied to the respective wafers 200. This makes it possible to improve the uniformity in the thickness of a film formed on each of the wafers 200. In addition, the gas flowing on the surfaces of the wafers 200 after the reaction, i.e., the reacted residual gas, flows toward an exhaust port, i.e., an exhaust pipe 231, which will be described later. The flow direction of the residual gas is not limited to a vertical direction but may be appropriately decided depending on a position of the exhaust port.

A precursor, which contains a predetermined element, for example, a silane precursor gas containing silicon (Si) as the predetermined element, is supplied from the gas supply pipe 232a into the process chamber 201 via the MFC 241a, the valve 243a and the nozzle 249a.

The silane precursor gas refers to a gaseous precursor, for example, a gas obtained by vaporizing a silane precursor which remains in a liquid state under a room temperature and an atmospheric pressure, or a precursor such as silane precursor which remains in a gas state under the room temperature and the atmospheric pressure. When the term "precursor" is used herein, it may refer to "a liquid precursor remaining in a liquid state," "a precursor gas remaining in a gaseous state," or both.

As the silane precursor gas, it may be possible to use, for example, a precursor gas containing Si and an amino group (amine group), i.e., an aminosilane precursor gas. The aminosilane precursor refers to a silane precursor having an amino group, and a silane precursor having an alkyl group such as a methyl group, an ethyl group, a butyl group or the like. The aminosilane precursor is a precursor containing at least Si, nitrogen (N) and carbon (C). That is, the aminosilane precursor referred to herein may be said to be an organic precursor or may be said to be an organic aminosilane precursor.

As the aminosilane precursor gas, it may be possible to use, for example, a bis(tertiary-butylamino)silane ($SiH_2[NH(C_4H_9)]_2$, abbreviation: BTBAS) gas. The BTBAS gas may be said to be a precursor gas which contains one Si atom in one molecule and which has a Si—N bond, an N—C bond or the like but does not have a Si—C bond. The BTBAS gas acts as a Si source.

In the case of using a liquid precursor such as BTBAS which remains in a liquid state under a room temperature and an atmospheric pressure, the precursor of a liquid state is vaporized by a vaporization system such as a vaporizer, a bubbler or the like and is supplied as the silane precursor gas (the BTBAS gas or the like).

A reactant having a chemical structure different from that of the precursor, for example, an oxygen (O)-containing gas, is supplied from the gas supply pipe 232b into the process chamber 201 via the MFC 241b, the valve 243b, and the nozzle 249b.

The O-containing gas acts as an oxidizing agent (oxidizing gas), i.e., an O source. As the O-containing gas, it may be possible to use, for example, an oxygen ($O_2$) gas, water vapor ($H_2O$ gas), or the like. In the case of using the $O_2$ gas as the oxidizing gas, for example, this gas is plasma-excited using a plasma source as described hereinbelow, and is supplied as an excitation gas ($O_2$* gas).

An inert gas, for example, a nitrogen ($N_2$) gas, is supplied from the gas supply pipes 232c and 232d into the process chamber 201 via the MFCs 241c and 241d, the valves 243c and 243d, and the nozzles 249a and 249b.

A precursor supply system as a first gas supply system is mainly constituted by the gas supply pipe 232a, the MFC 241a, and the valve 243a. A reactant supply system as a second gas supply system is mainly constituted by the gas supply pipe 232b, the MFC 241b, and the valve 243b. An inert gas supply system is mainly constituted by the gas supply pipes 232c and 232d, the MFCs 241c and 241d, and the valves 243c and 243d. The precursor supply system, the reactant supply system, and the inert gas supply system will be simply referred to as a gas supply system (gas supply part) herein.

(Substrate Support)

As illustrated in FIG. 1, a boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in multiple stages. With this configuration, it is hard for heat generated from the heater 207 to be transferred to a seal cap 219. However, the present embodiment is not limited to this configuration. For example, instead of installing the heat insulating plates 218 below the boat 217, a heat insulating tube as a tubular member made of a heat resistant material such as quartz or SiC may be installed under the boat 217.

(Plasma Generating Part)

Next, the plasma generating part will be described with reference to FIGS. 1 to 3B.

Figure 2:
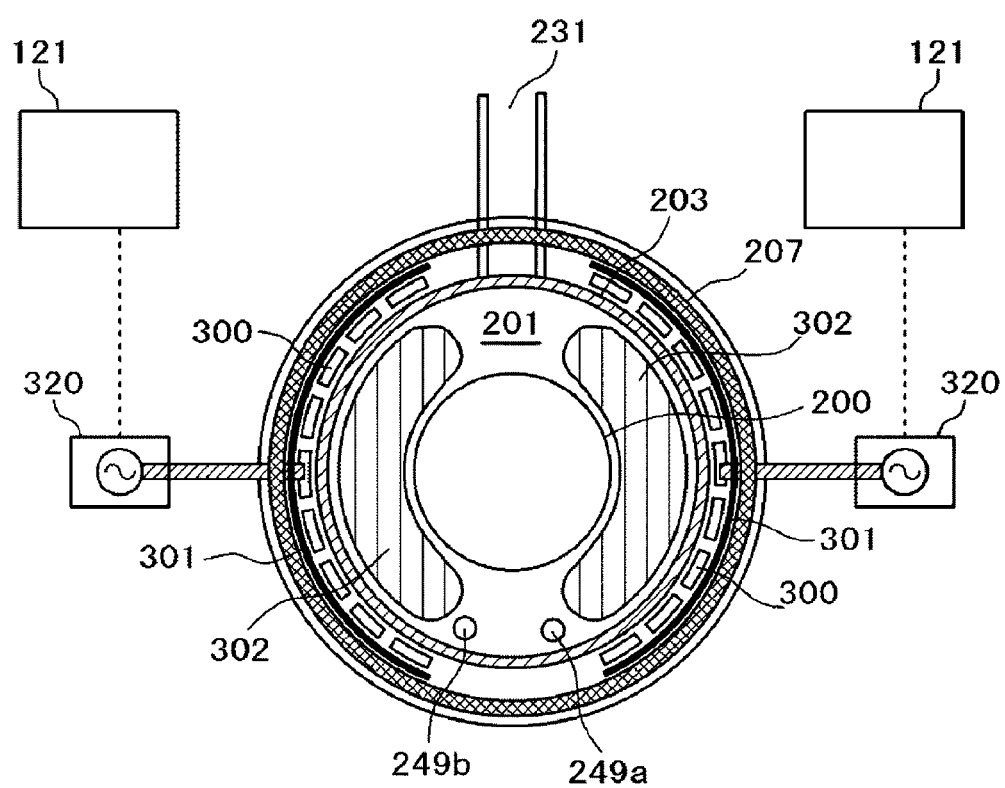
FIG. 2 is a cross sectional view taken along line A-A in the substrate processing apparatus illustrated in FIG. 1.

As illustrated in FIG. 2, plasma is generated in the reaction tube 203, which is a vacuum partition wall made of quartz or the like, using capacitively coupled plasma (CCP) when a reaction gas is supplied.

Figure 3A:
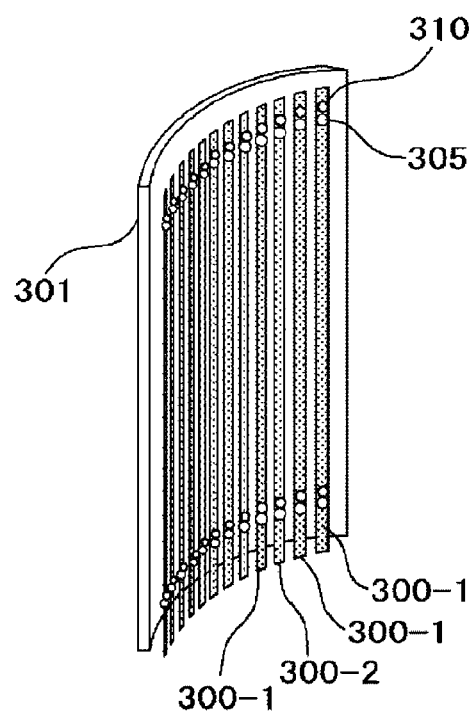
FIG. 3A is a perspective view when electrodes according to an embodiment of the present disclosure are installed on a quartz cover.

As illustrated in FIGS. 2 and 3A, the electrodes 300 are each configured as a thin plate having an elongated rectangular shape in the arrangement direction of the wafers 200. In the electrodes 300, first electrodes (hot electrodes) 300-1 to which a high-frequency power source 320 is connected via a matcher (not shown) and second electrodes (ground electrodes) 300-2 grounded to a reference potential of 0 V are arranged at equal intervals. In the present disclosure, when there is no need to specially distinguish and describe the electrodes, they will be described as the electrodes 300.

The electrodes 300 are arranged between the reaction tube 203 and the heater 207 in a substantially arc shape along the outer wall of the reaction tube 203, and are fixedly arranged on the inner wall surface of the quartz cover, which will be described later, formed in an arc shape having a central angle of, e.g., 30 degrees or more and 240 degrees or less. When the central angle is set less than 30 degrees, a plasma generation amount may be reduced. Further, when the central angle is set at an angle of more than 240 degrees, the heat energy from the heater 207 is interrupted, which may adversely affect wafer processing. In addition, when the central angle is set at an angle of more than 240 degrees, it is difficult to dispose the nozzles 249a and 249b and a temperature sensor 263, for example, a cascade thermocouple (TC), by avoiding a plasma generation region. For example, when the nozzles 249a and 249b and the like are disposed in the plasma generation region, particles (PC) are likely to be generated from the nozzles 249a and 249b and the like. Similarly, when the cascade TC is disposed in the plasma generation region, a discharge will occur from the TC line, resulting in damage to the wafers 200 or non-uniformity of a film. Therefore, by setting the central angle at 30 degrees or more and 240 degrees or less, it is possible to perform the wafer processing while avoiding interruption of the heat energy from the heater 207 and securing the plasma generation amount. Plasma active species 302 are generated in the reaction tube 203 by inputting a high frequency of, e.g., 13.56 MHz, from the high-frequency power source 320 to the electrodes 300 via the matcher (not shown). By the plasma thus generated, it is possible to supply the plasma active species 302 for substrate processing from the periphery of the wafers 200 to the surface of the wafers 200. The plasma generating part is mainly constituted by the electrodes 300 and the high-frequency power source 320. The plasma generating part may be considered as including the matcher (not shown) and the quartz cover 301 as the electrode fixing jig as described hereinbelow.

The electrodes 300 may be made of metal such as aluminum, copper, stainless steel or the like but may be made of an oxidation resistant material such as nickel, making it possible to perform the substrate processing while avoiding the deterioration of electric conductivity. In particular, the electrodes 300 are made of a nickel alloy material to which aluminum is added to form an AlO film, which is an oxide film having high heat resistance and corrosion resistance, on the surface of the electrodes. Since deterioration process of the electrodes can be avoided by the effect of such film formation, it is possible to avoid a reduction in plasma generation efficiency due to a reduction in the electric conductivity.

In addition, as illustrated in FIG. 4A, the electrode 300 has a notch portion 305 constituted by a circular notch portion 303 through which a projection head 311 as described hereinbelow passes and a slide notch portion 304 to which a projection shaft portion 312 slides.

Figure 5A:
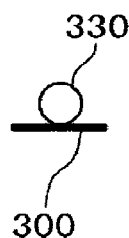
Figure 5B:
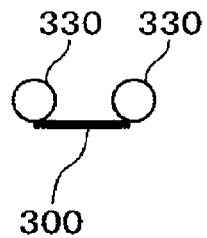
Figure 5C:
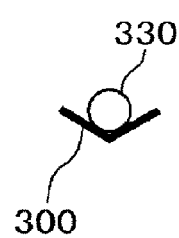
Figure 5D:
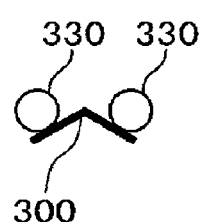
Figure 5E:
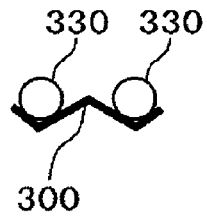

The electrode 300 may be configured to have a range of a thickness of 0.1 mm or more and 1 mm or less and a width of 5 mm or more and 30 mm or less in some embodiments so as to have a sufficient strength without significantly reducing the efficiency of wafer heating by a heat source. FIGS. 5A and 5B illustrate an example using an electrode 300 having a flat structure, and FIGS. 5C to 5E illustrate an example using an electrode 300 having a bending structure as a deformation suppressing part for preventing deformation due to heating of the heater 207. Since the electrodes 300 are arranged between the quartz reaction tube 203 and the heater 207, a bending angle of 90 to 175 degrees is suitable due to a space limit. It is necessary to be careful of over-bending because the electrode surface has a film formed by thermal oxidation, which may be delaminated due to thermal stress to generate particles. Furthermore, the example of FIG. 5E having a bending structure at three positions is particularly suitable for use in a high temperature zone because it is resistant to deformation by twisting.

Figure 3B:
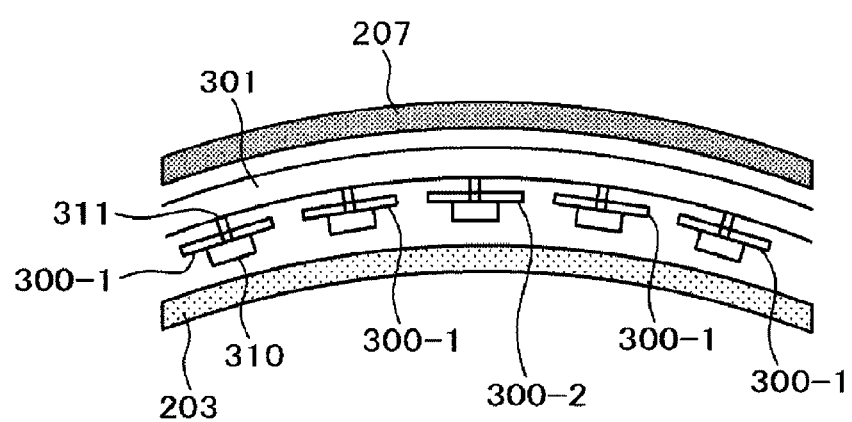
FIG. 3B is a view illustrating a positional relationship among a heater, a quartz cover, electrodes, projections for fixing the electrodes, and a reaction tube according to an embodiment of the present disclosure.

In a vertical type substrate processing apparatus, the frequency of the high-frequency power source 320 is set to 13.56 MHz, and an electrode having a length of 1 m, a width of 10 mm, and a thickness of 1 mm is adopted. As illustrated in FIG. 3B, the first electrodes 300-1 to which a plurality of arbitrary potentials are applied with an electrode pitch (center-to-center distance) of 20 mm and the second electrodes 300-2 to which a reference potential is applied are arranged on the outer wall of the reaction tube having a tube shape in the order of the first electrode 300-1, the first electrode 300-1, the second electrode 300-2, the first electrode 300-1, the first electrode 300-1, . . . , to generate plasma of a CCP mode. That is, in the electrodes 300, two first electrodes 300-1 are continuously arranged and one second electrode 300-2 is arranged to be sandwiched between two sets of continuously arranged first electrodes 300-1.

Figure 8:
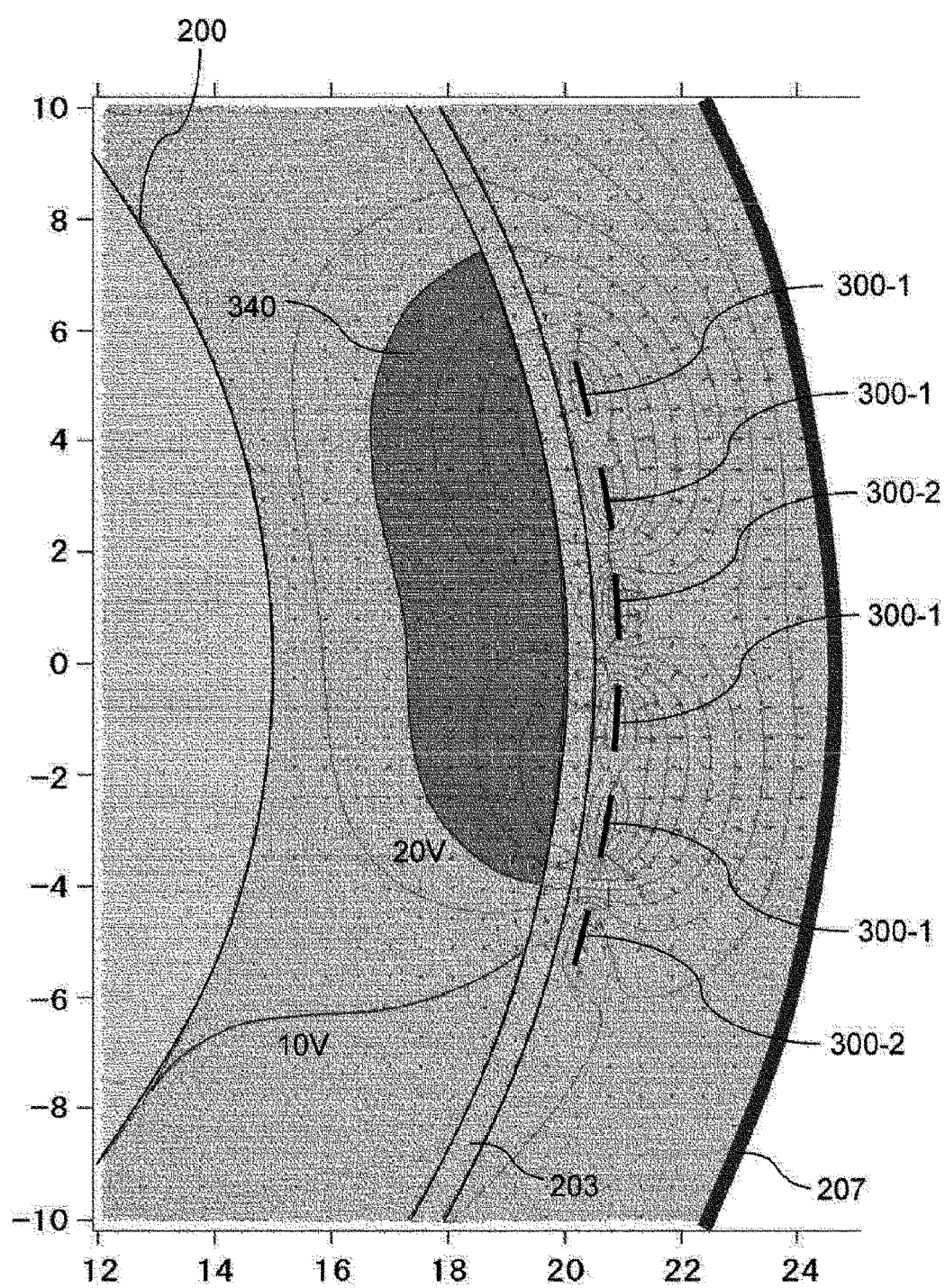
FIG. 8 is a diagram illustrating an equipotential distribution (curves) and an electric field distribution (arrows) in the case of using six electrodes according to an embodiment of the present disclosure, in which two sets of pairs of two hot electrodes to which a high-frequency power source is connected via a matcher and the remaining ground electrodes are alternately arranged.
Figure 9:
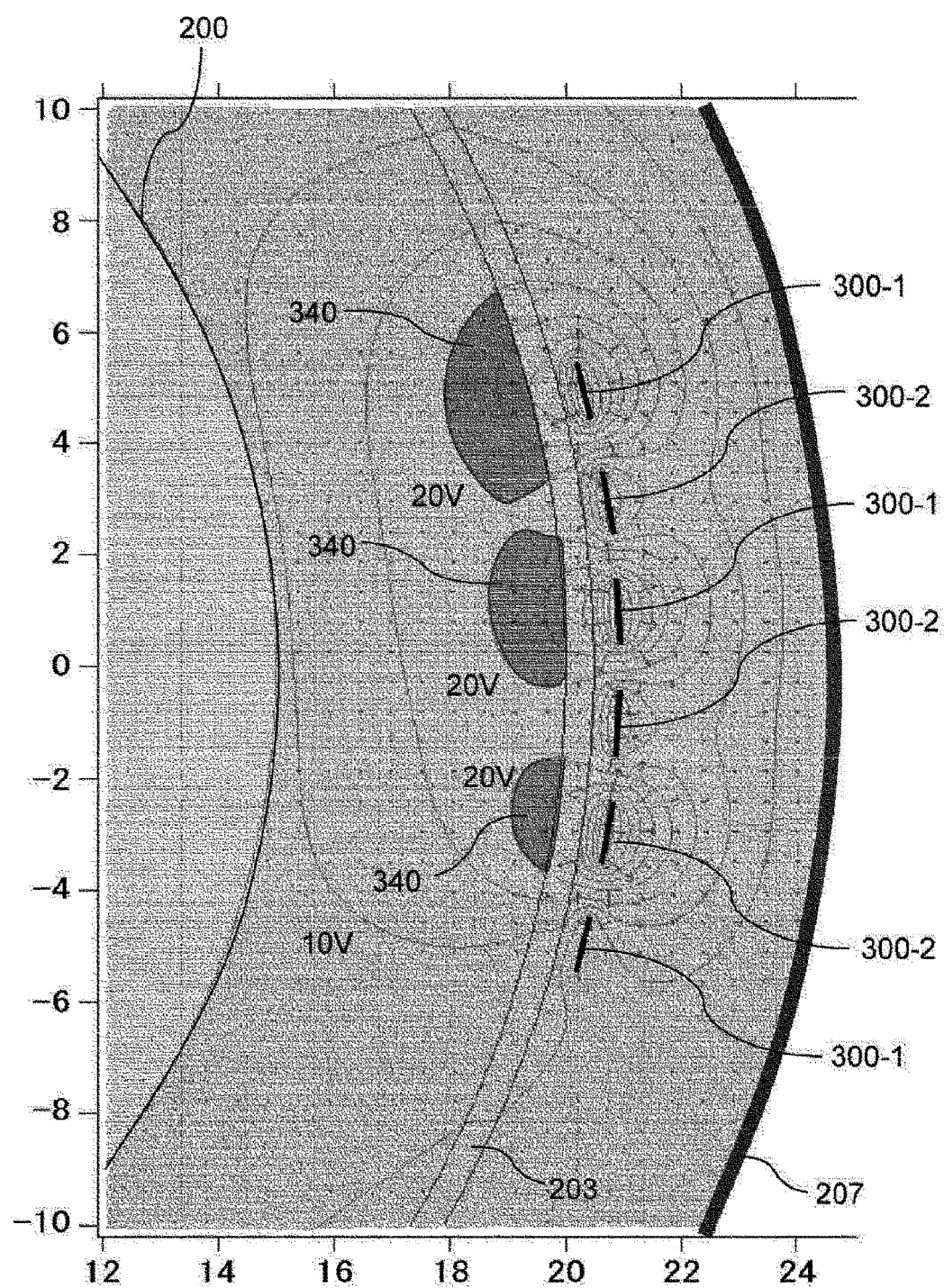
FIG. 9 is a diagram illustrating an equipotential distribution (curves) and an electric field distribution (arrows) in the case of using six electrodes according to a comparative example of the embodiment of the present disclosure, in which three hot electrodes to which the high-frequency power source is connected via a matcher and three ground electrodes are alternately arranged.
Figure 10:
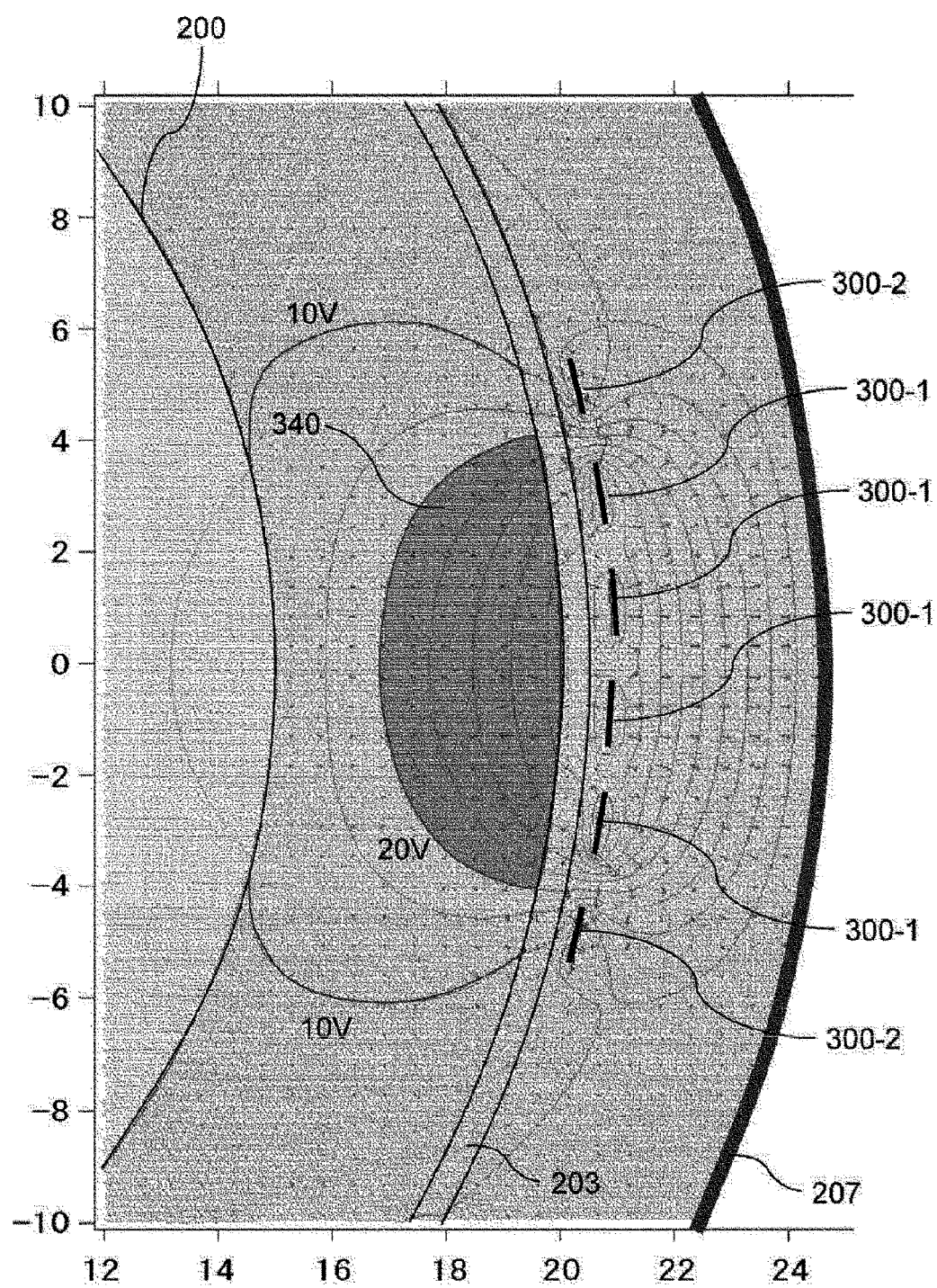
FIG. 10 is a diagram illustrating an equipotential distribution (curves) and an electric field distribution (arrows) in the case of using six electrodes according to an exemplary modification of the embodiment of the present disclosure, in which the remaining ground electrodes are arranged on both sides of one set of four hot electrodes to which the high-frequency power source is connected via a matcher.

An equipotential distribution (curves) and an electric field distribution (arrows) formed in the process chamber 201 in the case of using six electrodes 300 will be described with reference to FIGS. 8 to 10. FIG. 8 is a diagram illustrating an equipotential distribution (curves) and an electric field distribution (arrows) when two sets of hot electrodes 300-1, each set having two electrodes, to which a potential of 50 V is applied, and two ground electrodes 300-2 are alternately arranged (embodiment). FIG. 9 is a diagram illustrating an equipotential distribution (curves) and an electric field distribution (arrows) when three hot electrodes 300-1, to which a potential of 50 V is applied, and three ground electrodes 300-2 are alternately arranged (comparative example). FIG. 10 is a diagram illustrating an equipotential distribution (curves) and an electric field distribution (arrows) when two ground electrodes 300-2 are arranged on both sides of one set of four hot electrodes 300-1 to which a potential of 50 V is applied (modification).

Since an energy of 15.58 eV or more is required to ionize an $N_2$ gas such that the $N_2$ gas become $N_2^+$, it can be seen that the embodiment of FIG. 8 has the widest region 340 of potential equal to or greater than 20 V and the modification of FIG. 10 has the second widest region 340 of potential equal to or greater than 20 V, for example, when the regions 340 of potential equal to or greater than 20 V are compared. That is, the embodiment of FIG. 8 means that the plasma generation amount or the plasma generation efficiency is the highest, and a total surface area of the hot electrodes 300-1 is twice a total surface area of the ground electrodes 300-2. In the modification of FIG. 10, a total surface area of the hot electrodes 300-1 is twice a total surface area of the ground electrodes 300-2. In the comparative example of FIG. 9, a total surface area of the hot electrodes 300-1 is equal to a total surface area of the ground electrodes 300-2. The total surface area of the hot electrodes 300-1 may be two times or more and three times or less than the total surface area of the ground electrodes 300-2 in some embodiments. In addition, when the total surface area of the hot electrodes 300-1 is less than two times the total surface area of the ground electrodes 300-2, since a spread of the potential distribution is narrow, the plasma generation efficiency may be low. Further, when the total surface area of the hot electrodes 300-1 exceeds three times the total surface area of the ground electrodes 300-2, the potential distribution spreads to the edge portion of the wafers 200, and the wafers 200 become an obstacle, resulting in saturation in the plasma generation efficiency. In this state, the edge portion of the wafers 200 is also discharged and the wafers 200 may be easily damaged. In addition, since current flowing through the ground electrodes 300-2 is a multiple of the surface area of the hot electrodes, Joule heat may be generated at a high temperature. In this state, films of different qualities are formed on the surface of the wafers 200 and the edge portion of the wafers 200, which makes it difficult to ensure in-plane uniformity. When the total surface area of the hot electrodes 300-1 is two times or more and three times or less the total surface area of the ground electrodes 300-2, it is possible to realize high plasma generation efficiency while preventing the damage to the wafers 200 or the non-uniformity of films on the surface of the wafers 200 described above. However, it should be noted that the equipotential distribution and electric field distribution described above are a state before the plasma is generated, and when the plasma is generated, these distributions are greatly distorted due to a Debye shielding effect, and the space potential of the plasma is around 0 V.

An internal pressure of the furnace during the substrate processing may be controlled in a range of 10 Pa or more and 300 Pa or less in some embodiments. This is because, when the internal pressure of the furnace is lower than 10 Pa, a mean free path of gas molecules becomes longer than a Debye length of the plasma and the plasma directly making contact with the furnace wall becomes prominent, thus making it difficult to suppress the generation of particles. In addition, this is because, when the internal pressure of the furnace is higher than 300 Pa, since the plasma generation efficiency is saturated, the plasma generation amount does not change even if the reaction gas is supplied, and the reaction gas is unnecessarily consumed and at the same time, the transfer efficiency of plasma active species to the wafers degrades as the mean free path of the gas molecules becomes shorter.

(Electrode Fixing Jig)

Next, the quartz cover 301 as an electrode fixing jig for fixing the electrode 300 will be described with reference to FIGS. 3A to 4B. As illustrated in FIGS. 3A, 3B, 4A, and 4B, the plurality of installed electrodes 300 are hooked on projections 310 installed on an inner wall surface of the quartz cover 301 as the electrode fixing jig having a curved shape at its notch portion 305 are fixed by sliding, are unitized (hook type electrode unit) to be integrated with the quartz cover 301, and are installed on the outer periphery of the reaction tube 203. The electrodes 300 and the quartz cover 301 as the electrode fixing jig will be generally referred herein to as an electrode fixing unit. The quartz cover 301 and the electrodes 300 are made of materials such as quartz and a nickel alloy, respectively.

The quartz cover 301 may be configured to have a range of a thickness of 1 mm or more and 5 mm or less in some embodiments so as to have a sufficient strength without significantly reduce the efficiency of wafer heating by the heater 207. When the thickness of the quartz cover 301 is less than 1 mm, the quartz cover 301 cannot obtain a predetermined strength against its own weight or temperature change, and when it is configured to be larger than 5 mm, since the heat energy emitted from the heater 207 is absorbed, the wafers 200 cannot be properly heat-treated.

Furthermore, the quartz cover 301 has a plurality of projections 310 as a hook-shaped fixing portion for fixing the electrodes 300 on the inner wall surface on the reaction tube side. The projections 310 are each configured by the projection head 311 and the projection shaft portion 312. A maximum width of the projection head 311 is smaller than a diameter of the circular notch portion 303 of the notch portion 305 of the electrode 300, and a maximum width of the projection shaft portion 312 is smaller than a width of the slide notch portion 304. The notch portion 305 of the electrode 300 is shaped like a keyhole, and the slide notch portion 304 can guide the projection shaft portion 312 when sliding, and the projection head 311 has a structure that does not come off the slide notch portion 304. That is, it can be said that, the electrode fixing jig has a fixing portion having the projection head 311 which is a leading end portion that prevents the electrodes 300 from coming off the projection shaft portion 312 as a columnar portion to which the electrodes 300 are hooked. It is also apparent that the shapes of the notch portion 305 and the projection head 311 described above are not limited to the shapes illustrated in FIGS. 3A, 3B, 4A and 4B as long as the electrode 300 can be hooked to the quartz cover 301. For example, the projection head 311 may have a convex shape such as a hammer or a spike.

In order to keep the distance between the quartz cover 301 or the reaction tube 203 and the electrode 300 constant, an elastic body such as a spacer or a spring may be included in the quartz cover 301 or the electrode 300 therebetween and the spacer may have a structure integrated with the quartz cover 301 or the electrode 300.

In the preset embodiment, a spacer 330 as illustrated in FIG. 4B has a structure integrated with the quartz cover 301. A plurality of spacers 330 for one electrode are effective in fixing the distance constant.

In order to obtain high substrate processing capability at a substrate temperature of 500 degrees C. or lower, the occupancy rate of the quartz cover 301 may be set to a substantially arc shape having a central angle of 30 degrees or more and 240 degrees or less in some embodiments. Further, in order to avoid the generation of particles, an arrangement that avoids the exhaust pipe 231, which is an exhaust port, the nozzles 249a and 249b, or the like may be possible in some embodiments. That is, the quartz cover 301, which is the electrode fixing jig, is disposed on an outer periphery of the reaction tube 203 other than positions at which the nozzles 249a and 249b, which are a gas supply part installed in the reaction tube 203, and the exhaust tube 231, which is a gas exhaust part, are installed. In the present embodiment, two quartz covers 301 having a central angle of 110 degrees are installed in bilateral symmetry.

(Spacer)

Next, the spacer 330 for fixing the electrode 300 at a certain distance away from the surface of the quartz cover 301 as the electrode fixing jig or the outer wall of the reaction tube 203 is illustrated in FIGS. 4A and 4B.

For example, the spacer 330 is integrated with the quartz cover 301 with a columnar quartz material and is configured to make contact with the electrode so that the electrode 300 is fixed to the quartz cover 301. An example of a combination of the flat electrode 300 and a row of spacer 330 is illustrated in FIG. 5A, and an example of a combination of the electrode 300 of the same shape and two rows of spacers 330 is illustrated in FIG. 5B. When it is desired to strengthen the fixation of the electrode 300, as illustrated in FIGS. 5C to 5E, the spacers 330 may be arranged so that the spacers 330 are located at V-shaped valleys of bent portions of the electrode 300 in some embodiments. Without being limited to the aforementioned configuration, the spacers 330 may be integrated with either the electrode 300 or the quartz cover 301 regardless of a shape, as long as the electrode 300 may be fixed to the quartz cover 301 or the reaction tube 203 at a fixed distance. For example, the spacers 330 may be integrated with the quartz cover with a semi-cylindrical quartz material to fix the electrode 300, or the spacers 330 may be integrated with the electrode as a metal plate such as stainless steel (SUS) or the like to fix the electrode 300. Since the electrode fixing jig and the spacers are installed on the quartz cover, positioning of the electrode is facilitated, and since only the electrode can be replaced when it is deteriorated, the cost is reduced. Furthermore, since the spacers 330 generate a pressing force in one direction of the projection head 311 as the leading end portion described above via the surface making contact with the electrode 300, the electrode 300 is prevented from being deviated from the quartz cover 301. In the present disclosure, the spacers 330 may be included in the electrode fixing unit described above.

(Exhaust Part)

As illustrated in FIG. 1, the exhaust pipe 231 configured to exhaust an internal atmosphere of the process chamber 201 is installed in the reaction tube 203. A vacuum pump 246 as a vacuum exhaust device is connected to the exhaust pipe 231 via a pressure sensor 245 as a pressure detector (pressure detection part), which detects the internal pressure of the process chamber 201, and an auto pressure controller (APC) valve 244 as an exhaust valve (pressure regulation part). The APC valve 244 is configured so that a vacuum exhaust of the interior of the process chamber 201 and a vacuum exhaust stop can be performed by opening and closing the APC valve 244 while operating the vacuum pump 246 and the internal pressure of the process chamber 201 can be adjusted by adjusting an opening degree of the APC valve 244 based on pressure information detected by the pressure sensor 245 while operating the vacuum pump 246. An exhaust system is mainly constituted by the exhaust pipe 231, the APC valve 244, and the pressure sensor 245. The vacuum pump 246 may be regarded as being included in the exhaust system. The exhaust pipe 231 is not limited to being installed in the reaction tube 203 but may be installed in the manifold 209 just like the nozzles 249a and 249b.

(Peripheral Device)

A seal cap 219, which serves as a furnace opening cover configured to hermetically seal a lower end opening of the manifold 209, is installed under the manifold 209. The seal cap 219 is configured to make contact with the lower end of the manifold 209 at a lower side in the vertical direction. The seal cap 219 is made of metal such as, e.g., stainless steel (SUS) or the like, and is formed in a disc shape. An O-ring 220b, which is a seal member making contact with the lower end portion of the manifold 209, is installed on an upper surface of the seal cap 219.

A rotation mechanism 267 configured to rotate the boat 217 is installed at the opposite side of the seal cap 219 from the process chamber 201. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 115 is configured to load and unload the boat 217 into and from the process chamber 201 by moving the seal cap 219 up and down.

The boat elevator 115 is configured as a transfer device (transfer mechanism) which transfers the boat 217, i.e., the wafers 210, into and out of the process chamber 201. In addition, a shutter 219s as a furnace opening cover capable of hermetically sealing the lower end opening of the manifold 209 is installed under the manifold 209 while moving the seal cap 219 down with the boat elevator 115. The shutter 219s is made of metal such as, e.g., stainless steel (SUS) or the like, and is formed in a disc shape. An O-ring 220c, which is a seal member making contact with the lower end portion of the manifold 209, is installed on an upper surface of the shutter 219s. An opening/closing operation (an up-down movement operation or a rotational movement operation) of the shutter 219s is controlled by a shutter opening/closing mechanism 115s.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203 just like the nozzles 249a and 249b.

(Control Device)

Figure 6:
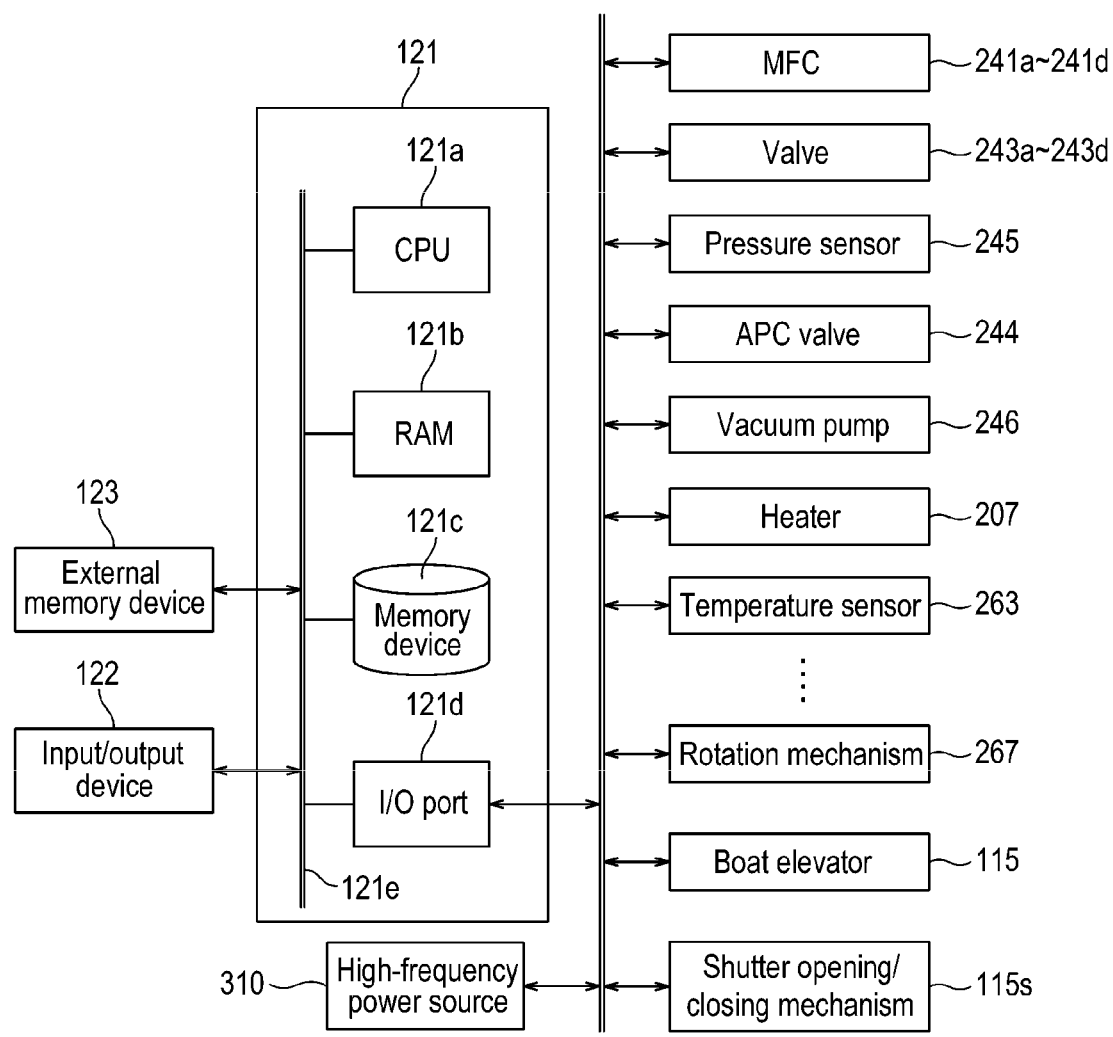
FIG. 6 is a schematic block diagram of a controller of the substrate processing apparatus illustrated in FIG. 1, in which an example of a control system of the controller is shown in a block diagram.
Figure 7:
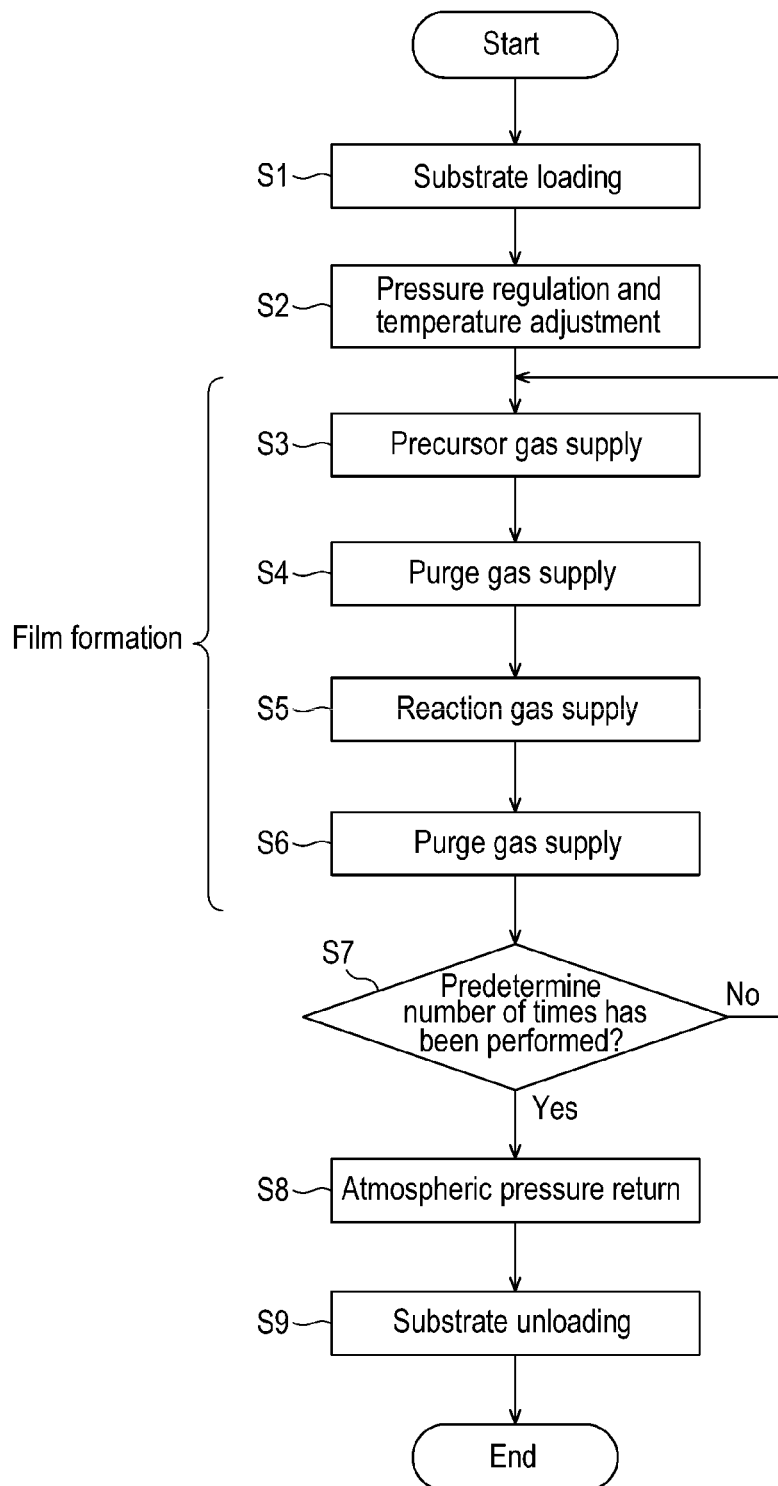
FIG. 7 is a flowchart illustrating an example of substrate processing using the substrate processing apparatus illustrated in FIG. 1.

Next, a control device will be described with reference to FIG. 7. As illustrated in FIGS. 6 and 7, a controller 121, which is a control part (control device), may be configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122 formed of, for example, a touch panel or the like, is connected to the controller 121.

The memory device 121c is constituted by, for example, a flash memory, a hard disk drive (HDD), or the like. A control program for controlling operations of a substrate processing apparatus, a process recipe for specifying sequences and conditions of a film-forming process as described hereinbelow, or the like is readably stored in the memory device 121c. The process recipe functions as a program for causing the controller 121 to execute each sequence in various processes (the film-forming process), as described hereinbelow, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program, data or the like read by the CPU 121a is temporarily stored.

The I/O port 121d is connected to the MFCs 241a to 241d, the valves 243a to 243d, the pressure sensor 245, the APC valve 244, the vacuum pump 246, the heater 207, the temperature sensor 263, the rotation mechanism 267, the boat elevator 115, the shutter opening/closing mechanism 115s, the high-frequency power source 320, and the like, as described above.

The CPU 121a is configured to read the control program from the memory device 121c and execute the same. The CPU 121a also reads the recipe from the memory device 121c according to an input of an operation command from the input/output device 122. In addition, the CPU 121a is configured to control, according to the contents of the recipe thus read, the operation of the rotation mechanism 267, flow rate adjusting operation of various kinds of gases by the MFCs 241a to 241d, opening/closing operation of the valves 243a to 243d, opening/closing operation of the APC valve 244, pressure regulating operation performed by the APC valve 244 based on the pressure sensor 245, driving and stopping of the vacuum pump 246, temperature adjusting operation performed by the heater 207 based on the temperature sensor 263, operation of normal or reverse rotating the boat 217 with the rotation mechanism 267 and adjusting the rotation angle and the rotation speed of the boat 217, operation of moving the boat 217 up and down with the boat elevator 115, operation of opening and closing the shutter 219s with the shutter opening/closing mechanism 115s, power supply to the high-frequency power source 320, and the like.

The controller 121 may be configured by installing, on the computer, the aforementioned program stored in an external memory device 123 (for example, a magnetic disc such as a hard disk, an optical disc such as a CD, a magneto-optical disc such as an MO, or a semiconductor memory such as a USB memory). The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Substrate Processing

A process example of forming a film on a substrate using the aforementioned substrate processing apparatus, which is one of the processes for manufacturing a semiconductor device, will be described with reference to FIG. 7. In the following descriptions, the operations of the respective parts constituting the substrate processing apparatus are controlled by the controller 121.

In the present disclosure, for the sake of convenience, a film-forming sequence illustrated in FIG. 7 may sometimes be denoted as follows. The same denotation will be used in the modifications and other embodiments as described hereinbelow.

$$(BTBAS \rightarrow O_2^*) \times n \Rightarrow SiO$$

When the term "wafer" is used herein, it may refer to a wafer itself or a laminated body of a wafer and a predetermined layer or film formed on the surface of the wafer. In addition, when the phrase "a surface of a wafer" is used herein, it may refer to a surface of a wafer itself or a surface of a predetermined layer or the like formed on a wafer. Furthermore, in the present disclosure, the expression "a predetermined layer is formed on a wafer" may mean that a predetermined layer is directly formed on a surface of a wafer itself or that a predetermined layer is formed on a layer or the like formed on a wafer. In addition, when the term "substrate" is used herein, it may be synonymous with the term "wafer."

(Loading Step: S1)

A plurality of wafers 200 is charged on the boat 217 (wafer charging), and the shutter 219s is moved by the shutter opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading).

In this state, the seal cap 219 seals the lower end of the manifold 209 through the O-ring 220b.

(Pressure Regulation and Temperature Adjustment Step: S2)

The interior of the process chamber 201 is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information (pressure regulation). The vacuum pump 246 may continue operating normally at least until a film-forming step as described hereinbelow is completed.

Furthermore, the interior of the process chamber 201 is heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution (temperature adjustment). The heating of the interior of the process chamber 201 by the heater 207 may be continuously performed at least until the film-forming step as described hereinbelow is completed. However, when the film-forming step is performed under a temperature condition lower than a room temperature, the heating of the interior of the process chamber 201 by the heater 207 may not be performed. In addition, when only the processing under this temperature is performed, the heater 207 is not necessary and may not be installed in the substrate processing apparatus. In this case, the configuration of the substrate processing apparatus can be simplified.

Subsequently, the rotation of the boat 217 and the wafers 200 by the rotation mechanism 267 begins. The rotation of the boat 217 and the wafers 200 by the rotation mechanism 267 may be continuously performed at least until the film-forming step as described hereinbelow is completed.

(Film-Forming Step: S3, S4, S5, and S6)

Thereafter, the film-forming step is performed by sequentially executing steps S3, S4, S5, and S6.

(Precursor Gas Supply Step: S3 and S4)

At step S3, a BTBAS gas is supplied to the wafer 200 in the process chamber 201.

The valve 243a is opened to allow the BTBAS gas to flow through the gas supply pipe 232a. The flow rate of the BTBAS gas is adjusted by the MFC 241a. The BTBAS gas is supplied from the gas supply holes 250a into the process chamber 201 via the nozzle 249a and is exhausted from the exhaust pipe 231. At this time, the BTBAS gas is supplied to the wafer 200. Simultaneously, the valve 243c is opened to allow an $N_2$ gas to flow through the gas supply pipe 232c. The flow rate of the $N_2$ gas is adjusted by the MFC 241c. The $N_2$ gas is supplied into the process chamber 201 together with the BTBAS gas and is exhausted from the exhaust pipe 231.

Furthermore, in order to prevent the BTBAS gas from entering the nozzle 249b, the valve 243d is opened to allow the $N_2$ gas to flow through the gas supply pipe 232d. The $N_2$ gas is supplied into the process chamber 201 via the gas supply pipe 232d and the nozzle 249b and is exhausted from the exhaust pipe 231.

The supply flow rate of the BTBAS gas controlled by the MFC 241a may be set at a flow rate which falls within a range of, for example, 1 sccm or more and 2,000 sccm or less, or 10 sccm or more and 1,000 sccm or less in some embodiments. The supply flow rates of the $N_2$ gas controlled by the MFCs 241c and 241d may be respectively set at a flow rate which falls within a range of, for example, 100 sccm or more and 10,000 sccm or less. The internal pressure of the process chamber 201 may be set at a pressure which falls within a range of, for example, 1 Pa or more and 2,666 Pa or less, or 67 Pa or more and 1,333 Pa or less in some embodiments. The time, during which the BTBAS gas is supplied to the wafer 200, may be set at a time period which falls within a range of, for example, 1 second or more and 100 seconds or less, or 1 second or more and 50 seconds or less in some embodiments. The temperature of the heater 207 is set such that the temperature of the wafer 200 (first temperature) becomes a temperature which falls within a range of, for example, 0 degree C. or higher and 150 degrees C. or lower, or a room temperature (25 degrees C.) or higher and 100 degrees C. or lower in some embodiments, or 40 degrees C. or higher and 90 degrees C. or lower in some embodiments.

By supplying the BTBAS gas to the wafer 200 under the aforementioned conditions, a Si-containing layer is formed on (a base film of the surface of) the wafer 200. The Si-containing layer may be a Si layer, an adsorption layer (a chemisorption layer or a physisorption layer) of BTBAS, or may include both of them.

After the Si-containing layer is formed, the valve 243a is closed to stop the supply of the BTBAS gas into the process chamber 201. At this time, the interior of the process chamber 201 is vacuum-exhausted by the vacuum pump 246 while opening the APC valve 244. Thus, the unreacted BTBAS gas, the BTBAS gas contributed to the formation of the Si-containing layer, or the reaction byproduct remaining within the process chamber 201 is removed from the interior of the process chamber 201 (S4). Furthermore, the supply of the $N_2$ gas into the process chamber 201 is maintained while opening the valves 243c and 243d. The $N_2$ gas acts as a purge gas. The precursor gas supply step may not include the step S4.

As the precursor gas, it may be possible to use, in addition to the BTBAS gas, a tetrakis-dimethylaminosilane ($Si[N(CH_3)_2]_4$, abbreviation: 4DMAS) gas, a tris-dimethylaminosilane ($Si[N(CH_3)_2]_3H$, abbreviation: 3DMAS) gas, a bis-dimethylaminosilane ($Si[N(CH_3)_2]_2H_2$, abbreviation: BDMAS) gas, a bis-diethylaminosilane ($Si[N(C_2H_5)_2]_2H_2$, abbreviation: BDEAS) gas, or the like in some embodiments. In addition, as the precursor gas, it may be possible to use various kinds of aminosilane precursor gases such as a dimethylaminosilane (DMAS) gas, a diethylaminosilane (DEAS) gas, a dipropylaminosilane (DPAS) gas, a diisopropylaminosilane (DIPAS) gas, a butylaminosilane (BAS) gas, a hexamethyldisilazane (HMDS) gas and the like, an inorganic halosilane precursor gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane, i.e., silicon tetrachloride ($SiCl_4$, abbreviation: STC) gas, a hexachlorodisilane ($Si_2Cl_6$, abbreviation: HCDS) gas, an octachlorotrisilane ($Si_3Cl_8$, abbreviation: OCTS) gas or the like, or a halogen-group-free inorganic silane precursor gas such as a monosilane ($SiH_4$, abbreviation: MS) gas, a disilane ($Si_2H_6$, abbreviation: DS) gas, a trisilane ($Si_3H_8$, abbreviation: TS) gas or the like in some embodiments.

As the inert gas, it may be possible to use, in addition to the $N_2$ gas, a rare gas such as an Ar gas, an He gas, an Ne gas, a Xe gas or the like.

(Reaction Gas Supply Step: S5 and S6)

After the film-forming process is completed, a plasma-excited $O_2$ gas as a reaction gas is supplied to the wafer 200 in the process chamber 201 (S5).

At this step, the opening/closing control of the valves 243b to 243d is performed in the same procedure as the opening/closing control of the valves 243a, 243c and 243d at step S3. The flow rate of the $O_2$ gas is controlled by the MFC 241b. The $O_2$ gas is supplied from the gas supply holes 250b into the process chamber 201 via the nozzle 249b. At this time, high-frequency power (frequency 13.56 MHz in the present embodiment) is supplied (applied) from the high-frequency power source 320 to the electrode 300. The $O_2$ gas supplied into the process chamber 201 is excited in a plasma state in the process chamber 201, is supplied to the wafer 200 as active species ($O^*$, $O_2^*$), and is exhausted from the exhaust pipe 231. The $O_2$ gas excited in the plasma state will be referred to as oxygen plasma.

The supply flow rate of the $O_2$ gas controlled by the MFC 241b may be set at a flow rate which falls within a range of, for example, 100 sccm or more and 10,000 sccm or less. The high-frequency power applied from the high-frequency power source 320 to the electrode 300 may be set at electric power which falls within a range of, for example, 50 W or more and 1,000 W or less. The internal pressure of the process chamber 201 may be set at a pressure which falls within a range of, for example, 10 Pa or more and 300 Pa or less. By using the plasma, it is possible to activate the $O_2$ gas even when the internal pressure of the process chamber 201 is in a relatively low pressure zone. The time, during which the active species obtained by plasma-exciting the $O_2$ gas are supplied to the wafer 200, may be set at a time which falls within a range of, for example, 1 second or more and 100 seconds, or 1 second or more and 50 seconds or less. Other processing conditions may be similar to the processing conditions of step S3 described above.

Ions generated in the oxygen plasma and electrically neutral active species are subjected to an oxidizing process as described hereinbelow on the Si-containing layer formed on the surface of the wafer 200.

By supplying the $O_2$ gas to the wafers 200 under the aforementioned conditions, the Si-containing layer formed on the wafers 200 is plasma-oxidized. At this time, Si—N bonds and Si—H bonds contained in the Si-containing layer are broken by the energy of the plasma-excited $O_2$ gas. N, H, and C bonded to N whose bonds with Si are broken are delaminated from the Si-containing layer. Then, Si in the Si-containing layer, which has dangling bonds due to delamination of N and the like, is bonded to O contained in the $O_2$ gas to form a Si—O bond. As this reaction proceeds, the Si-containing layer can be changed (modified) to a layer containing Si and O, i.e., a silicon oxide layer (SiO layer).

Further, in order to modify the Si-containing layer to the SiO layer, it is necessary to supply the 02 gas by plasma-exciting it. This is because, even when the 02 gas is supplied under a non-plasma atmosphere, the energy necessary to oxidize the Si-containing layer is insufficient in the aforementioned temperature zone and it is difficult to increase a Si—O bond by sufficiently delaminating N or C from the Si-containing layer or sufficiently oxidizing the Si-containing layer.

After the Si-containing layer is changed to the SiO layer, the valve 243b is closed to stop the supply of the $O_2$ gas. Further, the supply of the high-frequency power to the electrode 300 is stopped. Then, the $O_2$ gas or the reaction byproduct, which remains within the process chamber 201, is removed from the process chamber 201 under the same processing procedures and processing conditions as those of step S4 (S6). The reaction gas supply step may not include step S6.

As the oxidizing agent, i.e., the O-containing gas for plasma-exciting, it may be possible to use, in addition to the $O_2$ gas, a nitrous oxide ($N_2O$) gas, a nitrogen monoxide (NO) gas, a nitrogen dioxide ($NO_2$) gas, an ozone ($O_3$) gas, a peroxidation hydrogen ($H_2O_2$) gas, water vapor ($H_2O$), an ammonium hydroxide ($NH_4(OH)$) gas, a carbon monoxide (CO) gas, a carbon dioxide ($CO_2$) gas, or the like.

As the inert gas, it may be possible to use, in addition to the $N_2$ gas, for example, various kinds of rare gases exemplified at step S4.

(Performing a Predetermined Number of Times: S7)

A cycle which sequentially and non-simultaneously, i.e., non-synchronously, performs steps S3, S4, S5 and S6 described above is set as one cycle and this cycle is implemented a predetermined number of times (n times), namely once or more. Thus, a SiO film having a predetermined composition and a predetermined thickness can be formed on the wafer 200. The aforementioned cycle may be repeated multiple times. That is, the thickness of the SiO layer formed in one cycle may be set smaller than a desired thickness and the aforementioned cycle may be repeated multiple times until the thickness of the SiO film formed by laminating the SiO layer becomes equal to the desired thickness in some embodiments.

(Atmospheric Pressure Return Step: S8)

After the aforementioned film-forming process is completed, the $N_2$ gas as an inert gas is supplied from the respective gas supply pipes 232c and 232d into the process chamber 201 and is exhausted from the exhaust pipe 231. Thus, the interior of the process chamber 201 is purged with the inert gas, and the $O_2$ gas or the like, which remains within the process chamber 201, is removed from the interior of the process chamber 201 (inert gas purge). Thereafter, the internal atmosphere of the process chamber 201 is substituted by the inert gas (inert gas substitution). The internal pressure of the process chamber 201 is returned to an atmospheric pressure (atmospheric pressure return: S8).

(Unloading Step: S9)

Thereafter, the seal cap 219 is moved down by the boat elevator 115 to open the lower end of the manifold 209. The processed wafers 200 supported on the boat 217 are unloaded from the lower end of the manifold 209 to the outside of the reaction tube 203 (boat unloading). After the boat unloading, the shutter 219s is moved so that the lower end opening of the manifold 209 is sealed by the shutter 219s through the O-ring 220c (shutter closing). The processed wafers 200 are unloaded to the outside of the reaction tube 203 and are subsequently discharged from the boat 217 (wafer discharging). Further, after the wafer discharging, the empty boat 217 may be carried into the process chamber 201.

The internal pressure of the furnace during the substrate processing is controlled in a range of 10 Pa or more and 300 Pa or less in some embodiments. This is because, when the internal pressure of the furnace is lower than 10 Pa, the mean free path of gas molecules becomes longer than the Debye length of the plasma, and the plasma directly making contact with the furnace wall becomes prominent, thus making it difficult to prevent the generation of particles. In addition, when the internal pressure of the furnace is higher than 300 Pa, the plasma generation efficiency is saturated, and the plasma generation amount does not change even if the reaction gas is supplied. Further, the reaction gas is unnecessarily consumed and at the same time, the transfer efficiency of plasma active species to the wafers becomes worse as the mean free path of gas molecules becomes shorter.

(3) Effects According to the Present Embodiment

According to the present embodiment, one or more effects as set forth below may be achieved.

(a) By setting the surface area of the electrodes to which an arbitrary potential is applied to be twice or more the surface area of the electrodes to which a reference potential is applied, it is possible to increase the plasma generation amount or the plasma generation efficiency.

(b) By making the electrode of a nickel alloy material to which aluminum is added, it is possible to prevent the deterioration process of the electrodes, and to prevent a reduction in plasma generation efficiency due to a reduction in electrical conductivity.

(c) By setting the central angle of the electrode fixing jig to an arc shape of 30 degrees or more and 240 degrees or less and arranging the electrodes, it is possible to prevent the interruption of the heat energy from the heating device on the outer periphery of the electrode fixing jig to a minimum level so as not to affect the wafer processing.

While embodiments of the present disclosure have been specifically described above, the present disclosure is not limited to the aforementioned embodiments but may be differently modified without departing from the spirit of the present disclosure.

Furthermore, for example, in the aforementioned embodiments, there has been described an example in which a reactant is supplied after a precursor is supplied. The present disclosure is not limited to this configuration, and the supply order of the precursor and the reactant may be reversed. That is, the precursor may be supplied after the reactant is supplied. By changing the supply order, it is possible to change the quality or composition ratio of a film as formed.

In the aforementioned embodiments and the like, there has been described an example in which a SiO film is formed on the wafer 200. The present disclosure is not limited to this configuration but may be applied to a case where a Si-based oxide film such as a silicon oxycarbide film (SiOC film), a silicon oxycarbonitride film (SiOCN film), a silicon oxynitride film (SiON film) or the like is formed on the wafer 200 in some embodiments.

For example, by using a nitrogen (N)-containing gas such as ammonia ($NH_3$) gas, a carbon (C)-containing gas such as a propylene ($C_3H_6$) gas, a boron (B)-containing gas such as a boron trichloride ($BCl_3$) gas, or the like, other than or in addition to the aforementioned gases or these gases, for example, a SiN film, a SiON film, a SiOCN film, a SiOC film, a SiCN film, a SiBN film, a SiBCN film, a BCN film, or the like can be formed. In addition, the order which allows each gas to flow may be appropriately changed. Even in the case where these films are formed, the films may be formed under the same processing conditions as those of the aforementioned embodiments, and the same effects as those of the aforementioned embodiments may be achieved. In these cases, the reaction gas described above may be used for the oxidizing agent as the reaction gas.

Furthermore, the present disclosure may be applied to a case where a metal-based oxide film or a metal-based nitride film containing a metal element such as titanium (Ti), zirconium (Zr), hafnium (Hf), tantalum (Ta), niobium (Nb), aluminum (Al), molybdenum (Mo), tungsten (W) or the like is formed on the wafer 200 in some embodiments. That is, the present disclosure may be applied to a case where a TiO film, a TiOC film, a TiOCN film, a TiON film, a TiN film, a TiSiN film, a TiBN film, a TiBCN film, a ZrO film, a ZrOC film, a ZrOCN film, a ZrON film, a ZrN film, a ZrSiN film, a ZrBN film, a ZrBCN film, an HfO film an HfOC film, an HfOCN film, an HfON film, an HfN film, an HfSiN film, an HfBN film, an HfBCN film, a TaO film, a TaOC film, a TaOCN film, a TaON film, a TaN film, a TaSiN film, a TaBN film, a TaBCN film, an NbO film, an NbOC film, an NbOCN film, an NbON film, an NbN film, an NbSiN film, an NbBN film, an NbBCN film, an AlO film, an AlOC film, an AlOCN film, an AlON film, an AlN film, an AlSiN film, an AlBN film, an AlBCN film, an MoO film, an MoOC film, an MoOCN film, an MoON film, an MoN film, an MoSiN film, an MoBN Film, an MoBCN film, a WO film, a WOC film, a WOCN film, a WON film, a WN film, a WSiN film, a WBN film, a WBCN film, or the like is formed on the wafer 200 in some embodiments.

In these cases, as the precursor gas, it may be possible to use, for example, a tetrakis (dimethylamino) titanium (Ti[N$(CH_3)_2]_4$, abbreviation: TDMAT) gas, a tetrakis (ethylmethylamino) hafnium (Ti[N$(C_2H_5)(CH_3)]_4$, abbreviation: TEMAH) gas, a tetrakis (ethylmethylamino) zirconium (Zr[N$(C_2H_5)(CH_3)]_4$, abbreviation: TEMAZ) gas, a trimethylaluminum (Al$(CH_3)_3$, abbreviation: TMA) gas, a titanium tetrachloride (TiCl$_4$) gas, a hafnium Tetrachloride (HfCl$_4$) gas, or the like.

That is, the present disclosure may be applied to a case where a semi-metal-based film containing a semi-metal element or a metal-based film containing a metal element is formed in some embodiments. The processing procedures and processing conditions of the film-forming process may be similar to the processing procedures and processing conditions of the film-forming process illustrated in the embodiments or modifications described above. Even in these cases, the same effects as those of the aforementioned embodiments may be achieved.

Recipes used in a film-forming process may be prepared individually according to the processing contents and may be stored in the memory device 121c via a telecommunication line or the external memory device 123. Moreover, at the start of various processes, the CPU 121a may select an appropriate recipe from the recipes stored in the memory device 121c according to the processing contents in some embodiments. Thus, it is possible for a single substrate processing apparatus to form thin films of various kinds, composition ratios, qualities and thicknesses universally and with enhanced reproducibility. In addition, it is possible to reduce an operator's burden and to quickly start various processes while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

According to the present disclosure in some embodiments, it is possible to provide a technique capable of performing uniform substrate processing while maintaining a capability to generate active species by a plasma electrode.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   a reaction tube configured to form a process chamber in which a substrate is processed; and
   a plurality of electrodes including at least two electrodes to which a predetermined potential is applied and at least one electrode to which a reference potential is applied,
   wherein a surface area of the at least two electrodes to which the predetermined potential is applied is two times or more than a surface area of the at least one electrode to which the reference potential is applied,
   wherein the at least one electrode to which the reference potential is applied is arranged to be sandwiched between two sets of the at least two electrodes to which the predetermined potential is applied, and
   wherein each set consists of two or more electrodes, among the at least two electrodes to which the predetermined potential is applied, which are arranged continuously.

2. The apparatus according to claim 1, wherein the plurality of electrodes are made of a nickel alloy material to which aluminum is added.

3. The apparatus according to claim 1, wherein an interval between the at least one electrode to which the reference potential is applied and one of the at least two electrodes to which the predetermined potential is applied is the same as an interval between the two or more electrodes, among the at least two electrodes to which the predetermined potential is applied, which are arranged continuously.

4. The apparatus according to claim 1, wherein the at least one electrode to which the reference potential is applied and the at least two electrodes to which the predetermined potential is applied are installed on an outer periphery of the reaction tube.

5. The apparatus according to claim 1, further comprising an electrode fixing jig configured to fix the plurality of electrodes.

6. The apparatus according to claim 5, further comprising a spacer configured to separate the plurality of electrodes from a surface of the electrode fixing jig by a predetermined distance,
   wherein the plurality of electrodes includes a bent portion, and the spacer is configured to make contact with a valley of the bent portion.

7. The apparatus according to claim 5, wherein the electrode fixing jig is a quartz cover made of quartz.

8. The apparatus according to claim 5, wherein the electrode fixing jig is disposed on an outer periphery of the reaction tube other than positions of the reaction tube at which a gas supply part and a gas exhaust part are installed.

9. The apparatus according to claim 5, further comprising a heater installed outside the electrode fixing jig and configured to heat the substrate.

10. A plurality of electrodes, comprising:
    at least two electrodes to which a predetermined potential is applied; and
    at least one electrode to which a reference potential is applied,
    wherein the plurality of electrodes are configured to generate plasma in a process chamber,
    wherein a surface area of the at least two electrodes to which the predetermined potential is applied is two times or more than a surface area of the at least one electrode to which the reference potential is applied,
    wherein the at least one electrode to which the reference potential is applied is arranged to be sandwiched between two sets of the at least two electrodes to which the predetermined potential is applied, and
    wherein each set consists of two or more electrodes, among the at least two electrodes to which the predetermined potential is applied, which are arranged continuously.

11. The electrodes according to claim 10, wherein the plurality of electrodes are made of a nickel alloy material to which aluminum is added.

12. The electrodes according to claim 10, further comprising:
    an electrode fixing jig configured to fix the plurality of electrodes; and
    a spacer configured to separate the plurality of electrodes from a surface of the electrode fixing jig by a predetermined distance,
    wherein the plurality of electrodes includes a bent portion, and the spacer is configured to make contact with a valley of the bent portion.

13. The electrodes according to claim 12, wherein the electrode fixing jig is a quartz cover made of quartz.

14. A method of manufacturing a semiconductor device, comprising:
    loading a substrate into a substrate processing apparatus, the apparatus comprising:
      a reaction tube configured to form a process chamber in which the substrate is processed; and
      a plurality of electrodes including at least two electrodes to which a predetermined potential is applied and at least one electrode to which a reference potential is applied, and a surface area of the at least two electrodes to which the predetermined potential is applied being two times or more than a surface area of the at least one electrode to which the reference potential is applied, wherein the at least one electrode to which the reference potential is applied is arranged to be sandwiched between two sets of the at least two electrodes to which the predetermined potential is applied, and wherein each set consists of two or more electrodes, among the at least two electrodes to which the predetermined potential is applied, which are arranged continuously;
    processing the substrate by generating plasma in the process chamber; and
    transferring the substrate from the process chamber.

15. The method according to claim 14, wherein in the act of processing the substrate, the plasma is generated by the plurality of electrodes made of a nickel alloy material to which aluminum is added.

16. The method according to claim 14, wherein in the act of processing the substrate, the plasma is generated by the at least two electrodes, to which the predetermined potential is applied, connected to a high-frequency power source, and the at least one electrode, to which the predetermined potential is applied, connected to a ground.

* * * * *